(12) United States Patent
Ashida

(10) Patent No.: US 6,853,092 B2
(45) Date of Patent: Feb. 8, 2005

(54) CIRCUIT BOARD, MOUNTING STRUCTURE FOR SEMICONDUCTOR DEVICE WITH BUMPS, AND ELECTRO-OPTIC DEVICE AND ELECTRONIC DEVICE

(75) Inventor: Takeshi Ashida, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/682,357

(22) Filed: Oct. 9, 2003

(65) Prior Publication Data

US 2004/0124007 A1 Jul. 1, 2004

(30) Foreign Application Priority Data

Oct. 11, 2002 (JP) ........................................ 2002-298981

(51) Int. Cl.$^7$ ............................................. H01L 23/48
(52) U.S. Cl. ........................ 257/786; 257/778; 257/737
(58) Field of Search ................................. 257/737, 738, 257/778, 786

(56) References Cited

FOREIGN PATENT DOCUMENTS

JP          10-290058          10/1998

*Primary Examiner*—Roy Potter
(74) *Attorney, Agent, or Firm*—Harness, Dickey & Pierce, P.L.C.

(57) ABSTRACT

The present invention provides a circuit board including a plurality of pads for mounting a semiconductor device with bumps and a plurality of wires drawn from the respective pads, a mounting structure for the semiconductor device with bumps, and an electro-optic device and an electronic device. The circuit board has a region where the pitch in the longitudinal direction and the lateral direction of the plurality of pads are different from each other and the wires are preferentially drawn from a wider pitch side of the longitudinal direction or the lateral directions of the pads.

13 Claims, 19 Drawing Sheets

F I G. 1
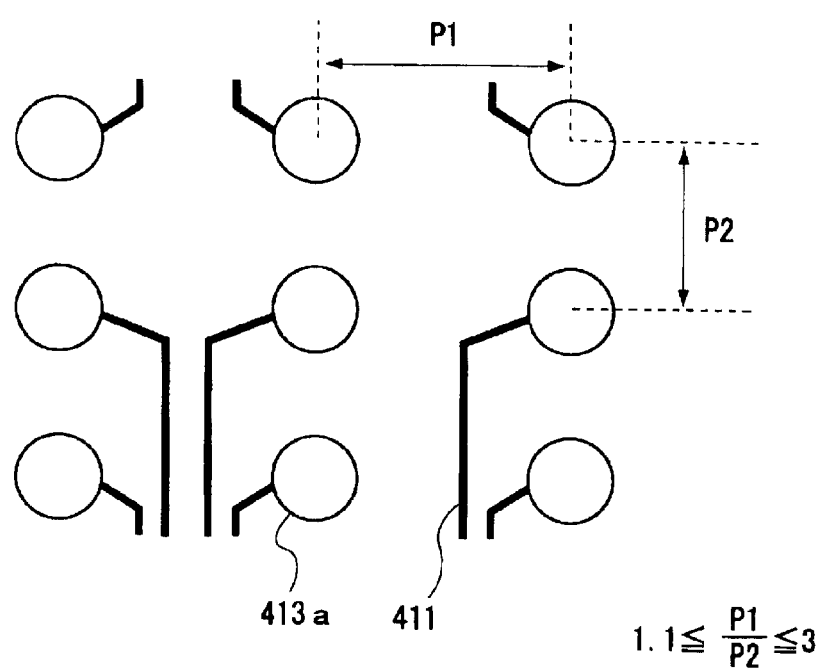
$1.1 \leq \dfrac{P1}{P2} \leq 3$ 413a 411

$0.6 \leq P1 \leq 2.0$ mm $P2 \leq 0.6$ mm

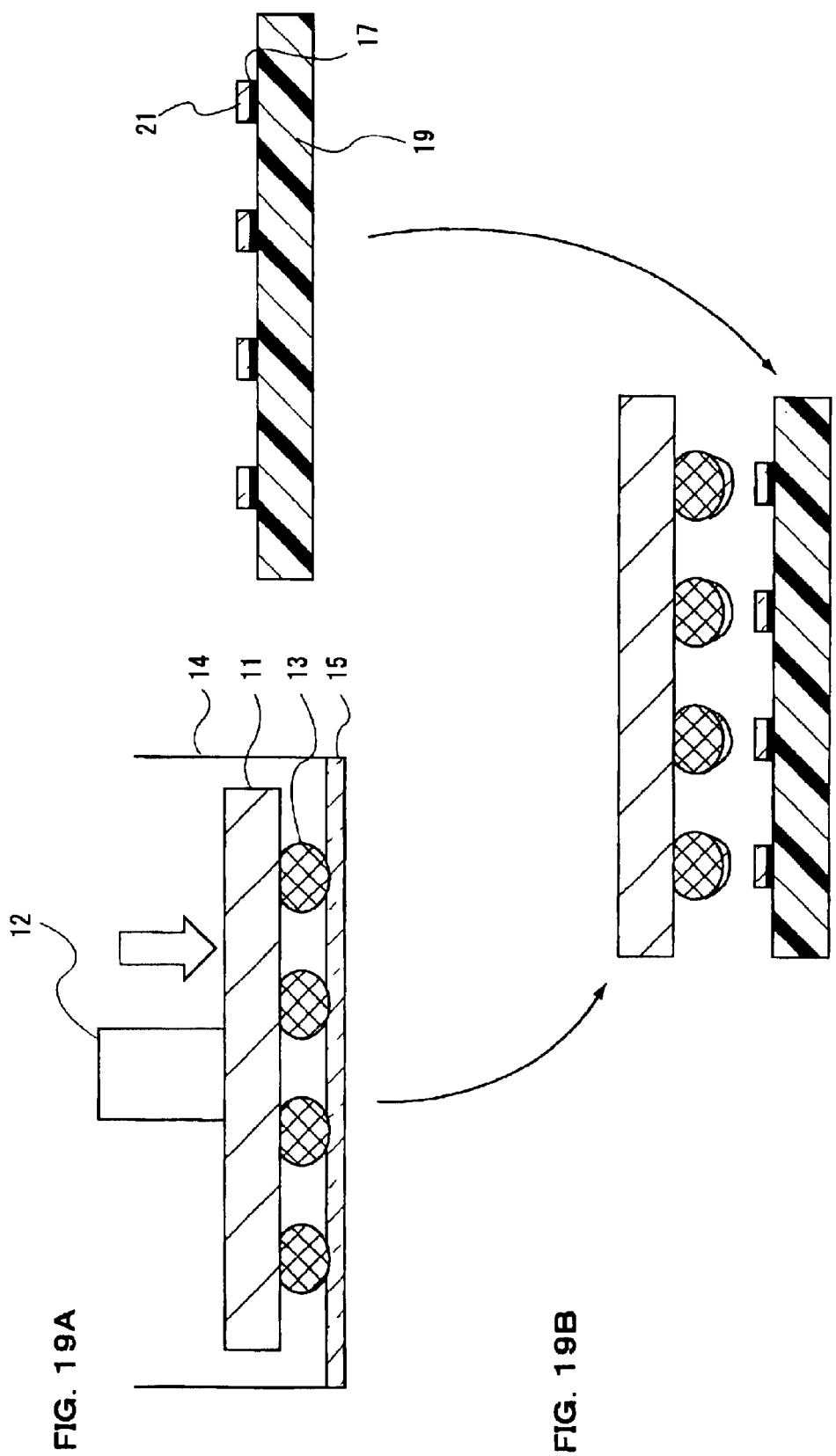

341
343

345
347
349

350

CIRCUIT BOARD, MOUNTING STRUCTURE FOR SEMICONDUCTOR DEVICE WITH BUMPS, AND ELECTRO-OPTIC DEVICE AND ELECTRONIC DEVICE

BACKGROUND OF THE INVENTION

1. Technical Field of the Invention

The present invention relates to a circuit board, a mounting structure for a semiconductor device with bumps, an electro-optic device and an electronic device. More particularly, the present invention concerns a circuit board in which the mounting position is not displaced even when a semiconductor device with fine bumps such as a ball grid array (hereinafter, referred to as a BGA) is mounted by reflowing, a mounting structure for the semiconductor device with the bumps, an electro-optic device and an electronic device including such a circuit board.

2. Related Art

A method of mounting a quad flat package (QFP) on a printed circuit board (PCB) has been widely performed as a mounting method adapted to the tendency of fine-pitch and multiple-pin lead terminals of a semiconductor. This is used in a state in which the QFP that is a flat package having a large number of gull-wing lead terminals on four sides of the package is mounted to a PCB that is normally made of resin or the like and is electrically connected to the conductor of the PCB.

However, problems have been pointed out in that the QFP tends to have low connection reliability because of a short circuit due to a solder bridge during mounting and a shortage in solder as a consequence to the fine-pitch and multiple-pin terminals. The QFP has also the problem of increasing a mounting area on the PCB by an amount of the outward projection of the lead terminals from the package.

Therefore, a mounting method that uses the BGA or a chip-size package (hereinafter, referred to as a CSP) and printed boards on which they are mounted are proposed in order to cope with the tendency to the fine-pitch and multiple-pin semiconductor devices.

Specifically, FIG. 24 shows a printed board in which lands 382 and 384 of a semiconductor package each having a different shape are disposed on the same printed board and the lands to which terminals having the same function in each package are connected with a pattern wire 388. With such a printed board, even when the shape of the package to be mounted to the printed circuit board is changed, it can be mounted on the same printed board without the need to make another printed board.

There is also a method for mounting an electronic part such as a BGA that is difficult to replace and repair so as not to cause poor soldering. More specifically, FIG. 25 shows the schematic flowchart of a mounting method 290 including step 291 of printing solder cream in a predetermined position on the PCB; step 292 of mounting a semiconductor device, by a mounter, on a predetermined position on the PCB on which the solder cream is printed, the semiconductor device having bumps such as a BGA (including a chip size package (CSP) with a pitch of 0.8 mm or less); step 293 of sorting nondefectives and defectives of the semiconductor devices by an X-ray examination; and step 294 of mounting by reflow heating only nondefectives in the semiconductor devices which have passed the X-ray examination.

As FIGS. 26(a) to 26(c) show, a mounting method has also been proposed by which a semiconductor device 346 with bumps and pads 341 of a substrate 343 are bonded by thermocompression via an anisotropic conductive film (hereinafter, referred to as an ACF) 349.

The mounting method using the ACF 349 offers the advantage that the occurrence of a short circuit between adjacent bumps can be efficiently prevented even when the pitch of the bumps 347 is as small as about 0.1 to 0.5 mm as in the CSP and also the many bumps 347 can be electrically connected by one operation.

However, with the conventional printed board, the solder material serving as a conductive material must be accurately printed on a fine land (pad) when a semiconductor device with fine bumps such as a BGA is mounted, thus posing the problems that it takes much time for positioning for printing and printing itself and the position of the printed solder material and the pad are easily displaced. Particularly, since the CSP is pitched more finely than the BGA, it is difficult in practice to accurately print and mount the solder material on the land (pad) of an easily deformable printed board such as a flexible printed circuit (hereinafter, referred to as a FPC).

According to the mounting method shown in FIG. 25, an X-ray examination must be performed before reflow heating, thus disadvantageously increasing the number of process steps, complicating production control, and increasing manufacturing time. The solder cream must be accurately printed on a fine pad, thus posing the problem of taking a lot of time for positioning for printing and printing itself.

The mounting method using the ACF offers the disadvantages that it costs a lot for the ACF and it is difficult to mount it simultaneously with other devices. In other words, the ACF that is mounted by thermo compression bonding and other devices mounted by reflow soldering must be separately mounted in consideration of the order of different mounting processes.

Thus, after due consideration to the above problems, the inventors have found that providing a region where the pitch in the longitudinal direction and the lateral direction of the pads are different and the wire of the pad is preferentially drawn from a wider pitch side of the longitudinal direction or the lateral direction of the pads decreases imperfect application of solder material, thus allowing a semiconductor device with a fine bump to be finely mounted by reflowing even on a relatively easily deformable substrate such as an FPC.

Accordingly, it is an object of the present invention to provide a circuit board, a mounting structure for a semiconductor device with bumps, an electro-optic device and an electronic device in which the mounting position of the semiconductor device is not displaced even when a semiconductor device with fine bumps such as a BGA is mounted by reflowing.

SUMMARY

The present invention provides a circuit board including a plurality of pads for mounting a semiconductor device and a plurality of wires drawn from the respective pads. The circuit board has a region where the pitch in the longitudinal direction and the lateral direction of the plurality of pads are different from each other and the wires are drawn from a wider pitch side of the longitudinal direction or lateral direction of the pads, thus solving the above problems.

Such a structure relatively increases the distance between the pad and the wires, thus reducing the occurrence of a short circuit due to the shear in printing a solder material or the like.

In forming the circuit board of the present invention, it is preferable to set the ratio P1/P2 within the range of 1.01 to 3 where P1 is a wider pitch of the pads and P2 is a narrower pitch.

Such a structure reliably increases the distance between the pads and the wires, thus reducing the occurrence of a short circuit due to the shear in printing a solder material or the like.

In forming the circuit board of the present invention, it is preferable to set the wider pitch of the pads within the range of 0.4 to 2.0 mm and to set the narrower pitch to a value smaller than that of the wider pitch.

Such a structure reliably increases the distance between the pads and the wires, thus reducing the occurrence of a short circuit due to the shear in printing a solder material or the like.

In forming the circuit board of the present invention, it is preferable to determine the aspect ratio of the pad in proportion to the pitch of the longitudinal direction of the pads and the pitch of the lateral direction of the pads.

Such a structure further increases the distance between the pads and the wires, thus reducing the occurrence of a short circuit due to the shear in printing a solder material or the like.

In forming the circuit board of the present invention, it is preferable to provide a region where the pitch in the longitudinal direction and the lateral direction of the pads are different from each other in the vicinity of the center of the bottom of the semiconductor device.

Such a structure reduces the occurrence of a short circuit due to the shear in printing a solder material or the like and increases the flexibility of circuit wiring.

In forming the circuit board of the present invention, it is preferable to provide a region where the pitch in the longitudinal direction and the lateral direction of the pads are different from each other in the vicinity of the periphery of the bottom of the semiconductor device.

Such a structure reduces the occurrence of a short circuit due to the shear in printing a solder material or the like and increases the flexibility of circuit wiring.

In forming the circuit board of the present invention, it is preferable to provide a region where the pitch in the longitudinal direction and the lateral direction of the pads are different from each other in a block structure and to preferentially draw the wires of the pads by using the space between the blocks.

Such a structure reduces the occurrence of a short circuit due to the shear in printing a solder material or the like and increases the flexibility of circuit wiring.

In forming the circuit board of the present invention, the semiconductor device applied is preferably a ball grid array (BGA).

Such a structure provides a circuit board ready for the tendency of fine-pitch wiring and multiple pins.

According to another embodiment of the present invention, a mounting structure for a semiconductor device with bumps is provided wherein a semiconductor device with bumps is mounted to a circuit board through a solder material applied on the pads, the circuit board having a region where the pitch in the longitudinal direction and the lateral direction of the pads are different from each other, in which wires are preferentially drawn from a wider pitch side of the longitudinal direction or the lateral direction of the pads.

Such a structure relatively increases the distance between the pads and the adjacent wires, thus reducing the occurrence of a short circuit due to the shear in printing a solder material or the like and the displacement in mounting the semiconductor device with bumps.

In constructing the mounting structure for the semiconductor device with bumps according to the invention, part of the solder material is preferably adhered to the pads of the semiconductor device with bumps.

Such a structure reduces the displacement of the semiconductor device even when a semiconductor device with fine bumps such as a BGA is mounted to an easily deformable flexible printed circuit or the like.

In constructing the mounting structure for the semiconductor device with bumps according to the invention, an under filling having the following properties preferably fills up the area between the semiconductor device with bumps and the circuit board:

1) Volume resistance within the range of $1 \times 10^6$ to $1 \times 10^{20}$ $\Omega \cdot cm$;
2) Tensile strength within the range of 1 to 200 MPa; and
3) Elongation within the range of 10 to 500%.

Such a structure provides a mounting structure for a semiconductor device with bumps having high environmental stability and mechanical characteristics.

According to another embodiment of the present invention, an electro-optic device includes a semiconductor device with bumps mounted on a circuit board having a region where the pitch in the longitudinal direction and the lateral direction of the pads are different from each other as a driving element or a power-supply element, in which wires are preferentially drawn from a wider pitch side of the longitudinal direction or the lateral direction of the pads.

Such a structure provides an electro-optic device including a circuit board causing less occurrences of a short circuit due to the imperfect application of a solder material or the like and less displacement in mounting the semiconductor device with bumps.

According to another embodiment of the present invention, an electronic device includes the electro-optic device and control means for controlling the electro-optic device.

Such a structure provides an electronic device including a circuit board having high environmental stability and causing less occurrences of a short circuit.

BRIEF DESCRIPTION OF THE DRAWINGS

FIG. 1 is a diagram for explaining a circuit board according to a first embodiment of the present invention.

FIGS. 19(a) and 19(b) are process charts for explaining yet another method for mounting a semiconductor device with bumps onto a circuit board having a solder resist (No. 3).

DETAILED DESCRIPTION

Embodiments of a mounting structure for a semiconductor device with bumps according to the present invention, and an electro-optic device and an electronic device using the same will be specifically described with reference to the drawings.

It is to be understood that the embodiments describe only examples of the invention and do not obviously limit the invention and that various modifications may be made within the scope of the object of the invention.

First Embodiment

Referring to FIG. 1, a first embodiment is a circuit board including a plurality of pads 413a for mounting a semiconductor device with bumps and a plurality of wires 411 drawn from the plurality of pads 413a, the circuit board including a region where the pitch in the longitudinal direction and the lateral direction of the pads 413a are different, and the wires 411 being preferentially drawn from a wider pitch side of the longitudinal direction or the lateral direction of the pads 413a.

1. Pad (1) Anisotropy

1) Ratio of Pitches

It is preferable to set the ratio P1/P2 within the range of 1.01 to 3 where P1 is a wider pitch of the pads and P2 is a narrower pitch.

This is because when the ratio P1/P2 becomes less than 1.01, it may be difficult to draw the wires to the exterior and to route them. On the other hand, when the ratio P1/P2 has exceeded 3, the number of pads that can be arranged in unit area may be excessively limited, or adversely it becomes difficult to route the wires.

Therefore, it is more preferable to set the ratio P1/P2 within the range of 1.05 to 2.5, and still further preferable within the range of 1.1 to 2.0.

2) Pitch

Figure 2:
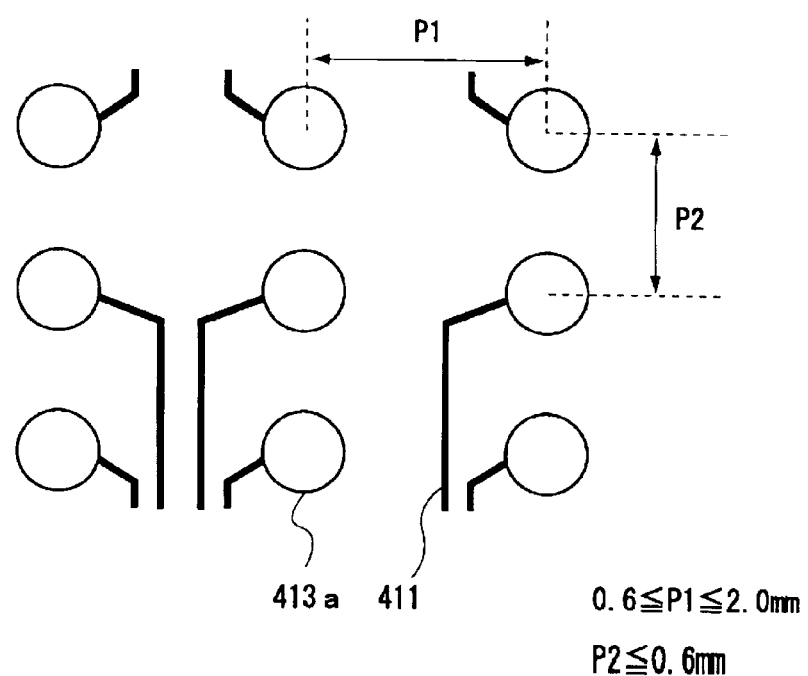
FIG. 2 is a diagram for explaining the distance between adjacent pads.

As FIG. 2 shows, it is preferable to set the wider pitch of the pads within the range of 0.4 to 2.0 mm and to set the narrower pitch to a value smaller than that of the wider pitch.

This is because when the wider pitch of the pads is at least 0.4 mm, it may be easy to draw the wires to the exterior and to route them. On the other hand, when the pitch has exceeded 2.0 mm, the number of pads that can be arranged in unit area may be excessively limited.

Therefore, it is more preferable to set the wider pitch of the pads within the range of 0.45 to 1.8 mm and to set the narrower pitch to a value smaller than the wider pitch, and still further preferable to set the wider pitch of the pads within the range of 0.5 to 1.6 mm and to set the narrower pitch to a value smaller than the wider pitch.

3) Aspect Ratio of Pad

Figure 3:
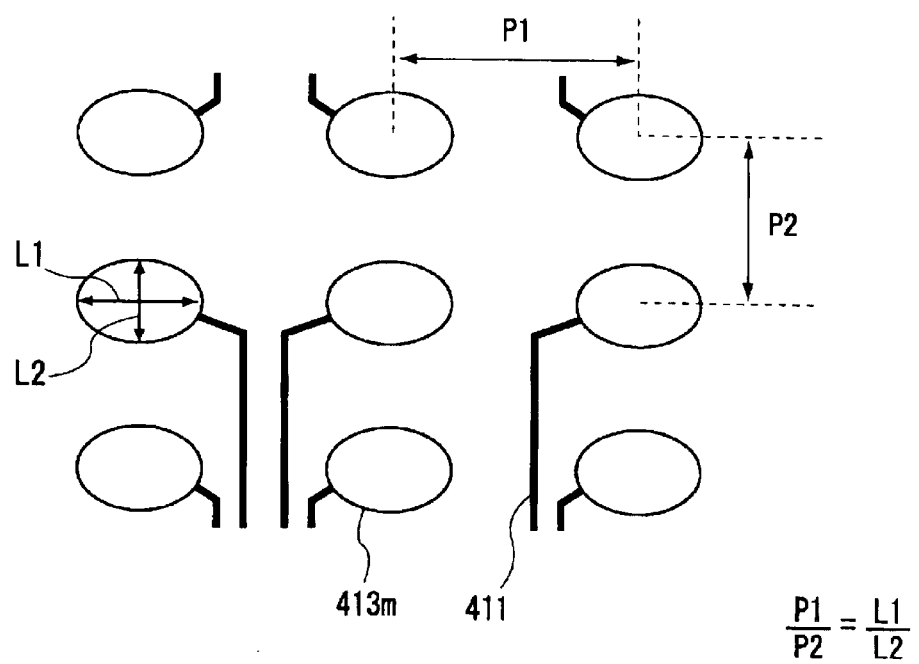
FIG. 3 is a diagram for explaining the aspect ratio of a pad.

As FIG. 3 shows, it is preferable to determine the aspect ratio of a pad 413 m in proportion to the pitch of the longitudinal direction of the pads and the pitch of the lateral direction of the pads. More specifically, it is preferable to determine the ratio L1/L2 in proportion to the ratio P1/P2 where P1 is a wider pitch of the pads and P2 is a narrower pitch, and L1 is the width of the pad corresponding to the direction P1 and L2 is the width of the pad corresponding to the direction P2.

This is because the correspondence of the aspect ratio of the pad and the pitch of the pads increases the area of the pad and facilitates the drawing of the wires to the exterior and the routing.

4) Position

Figure 4A:
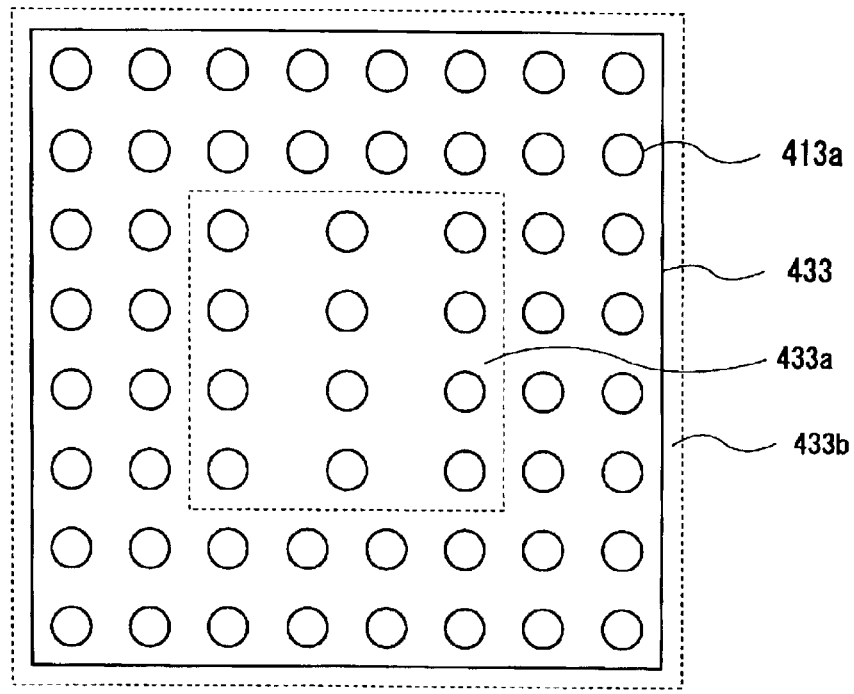
FIG. 4 is a diagram for explaining a region where the distance between the adjacent pads is different (No. 1).

As FIG. 4(a) shows, it is preferable to provide a region 433a, in the vicinity of the center of the bottom 433 (or at least one surface) of the BGA, where the pitch in the longitudinal direction and the lateral direction of the pads are different from each other.

This is because the provision of the region where the pitches are different allows the wires to be drawn with higher priority to the direction having a wider pitch of the longitudinal direction or the lateral direction even when the routing of wires is concentrated in the vicinity of the center of the bottom of the BGA.

Figure 4B:
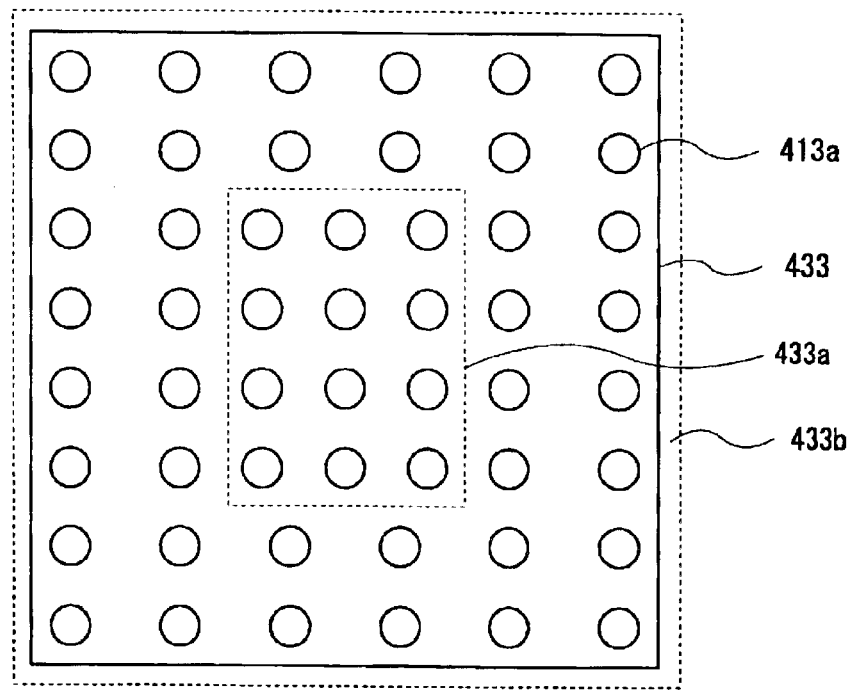

On the other hand, referring to FIG. 4(b), it is preferable to provide a region 433b, in the vicinity of the periphery of the bottom 433 (or at least one surface) of the BGA, where the pitch of the longitudinal direction of the pads and the pitch of the lateral direction of the pads are different from each other.

This is because the provision of the region where the pitches are different allows the wires to be drawn with higher priority to the direction having a wider pitch side of the longitudinal direction or the lateral direction even when the routing of wires is concentrated in the vicinity of the periphery of the bottom of the BGA.

5) Block

Figure 5:
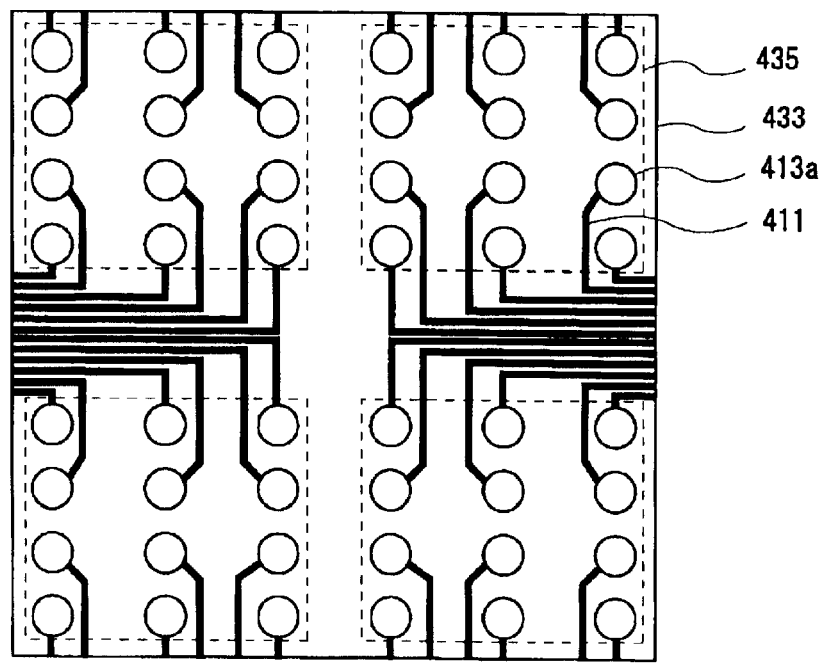
FIG. 5 is a diagram for explaining a region where the distance between the adjacent pads is different (No. 2).

As FIG. 5 shows, it is preferable to provide a region where the pitch in the longitudinal direction and the lateral direction of the pads are different from each other in a block structure and to preferentially draw wires 411 of the pads by using the space between the blocks 435.

This is because the provision of the space between the blocks increases the margin for applying a solder material through the use of the space. This decreases the occurrence of a short circuit due to inferior application of the solder material or the like. This also increases the flexibility of circuit wiring and facilitates the drawing of wires to the exterior by using the space between the blocks.

(2) Area of Pad

It is preferable to set the area of the pad within the range of 0.01 to 0.5 mm$^2$.

This is because when the area of the pad becomes less than 0.01 mm$^2$, the application of a solder material may become difficult and the electrical connection with the BGA may become unstable.

On the other hand, when the area of the pad exceeds 0.5 mm$^2$, the routing of wires may become difficult, the width of the wiring may be excessively narrowed and also a solder bridge may occur.

Therefore, it is more preferable to set the area of the pad within the range of 0.03 to 0.3 mm$^2$, and it is further preferable to set within the range of 0.05 to 0.1 mm$^2$.

(3) Plan Shape of Pad

Figure 6:
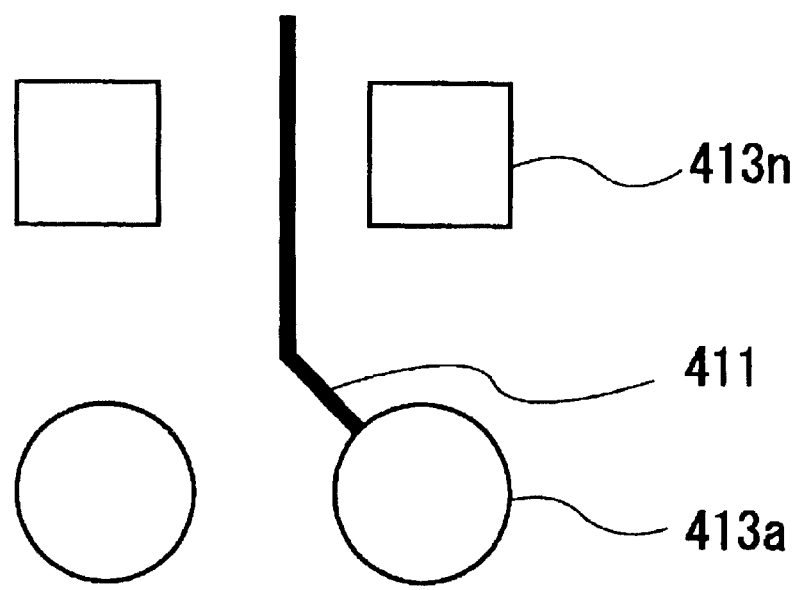
FIG. 6 is a diagram showing pads in plan view.

As FIG. 6 shows, the pad is preferably a circle or a square in plan view. This is because such a plan shape enhances the formation with high reproducibility and allows the entire surface to be efficiently used.

Figure 7A:
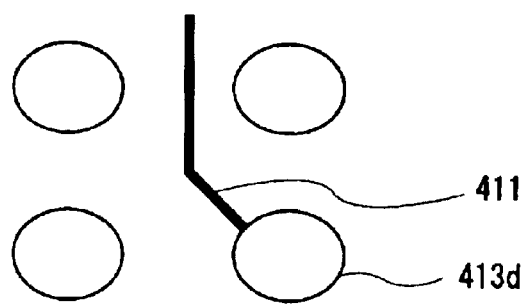
FIGS. 7(a) to 7(d) are diagrams showing deformation pads in plan view.
Figure 7B:
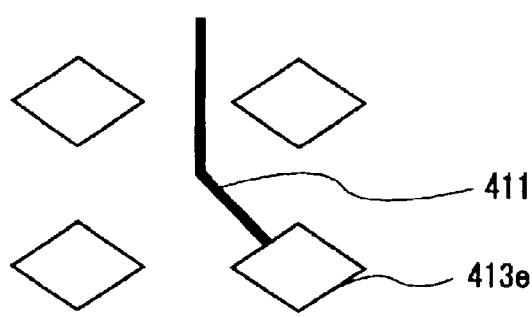
Figure 7C:
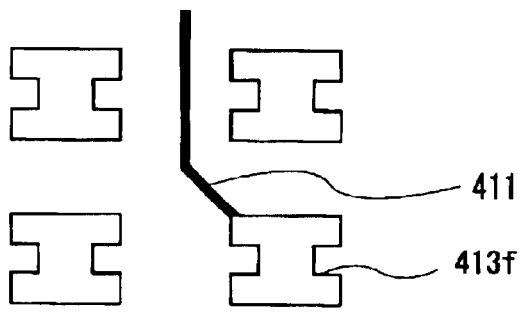
Figure 7D:
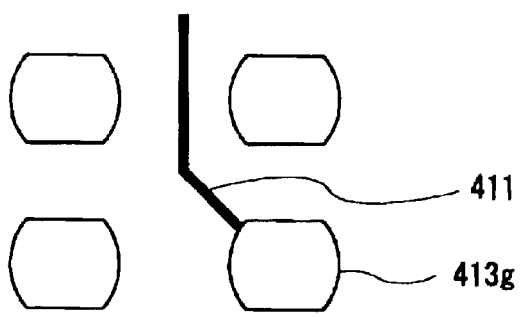
Figure 8A:
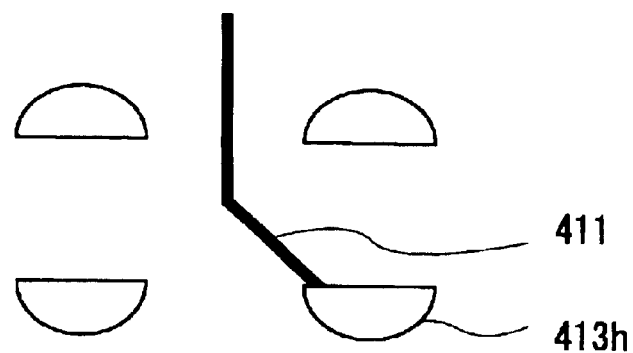
FIGS. 8(a) to 8(c) are diagrams showing deformation pads in plan view.
Figure 8B:
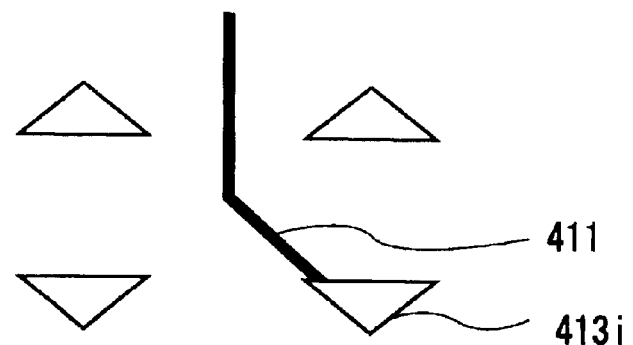
Figure 8C:
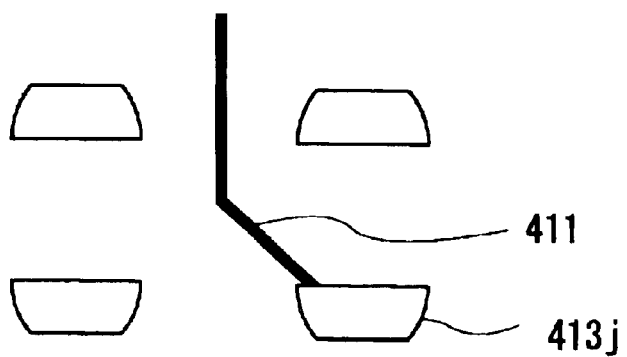
Figure 9A:
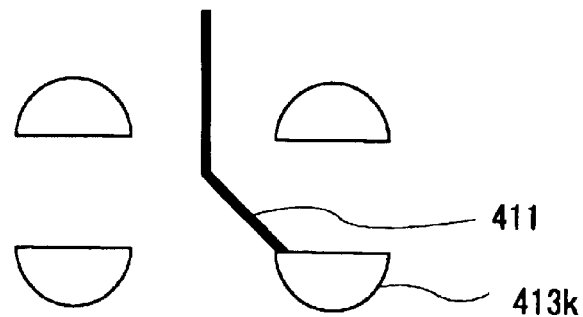
FIGS. 9(a) and 9(b) are diagrams showing other deformation pads in plan view.
Figure 9B:
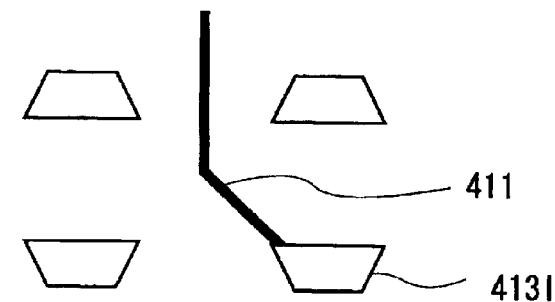

However, the pad may also be a non-circle or a non-square in plan view. For example, the pad may be an ellipse as shown in FIG. 7(a); a rhomboid (e.g. diamond) as shown in FIG. 7(b), a deformed rectangle (H-shape), as shown in FIG. 7(c), a drum shape as shown in FIG. 7(d), a semi-ellipse (half of an ellipse) as shown FIG. 8(a), a semi-rhomboid (half of a rhomboid—e.g. triangle) as shown in FIG. 8(b), a semi-drum (half of a drum) as shown in FIG. 8(c), a semicircle (half of a circle) as shown in FIG. 9(a), a semi-polygon (half of a polygon) as shown in FIG. 9(b), or at least one of a one-third circle, a two-thirds circle, a one-fifth circle, a two-fifths circle, a three-fifths circle, or a four-fifths circle.

This is because forming a deformed pad having such a plan shape decreases the probability of preventing the routing of wires and ensures a wide margin for displacement when applying the solder material, thereby enhancing the production efficiency of a circuit board. The pad with such a plan shape can be formed with high reproducibility.

2. Semiconductor Device with Bumps (1) Type

The type of the semiconductor device with bumps according to the present invention is not particularly limited. However, it is preferable to use BGAs 60, 70, and 80, shown in FIGS. 10 to 12, and a wafer-level chip size package (WCSP) 90, shown in FIG. 13 so as to cope with the tendency of fine-pitch wiring and multiple pins.

Figure 10:
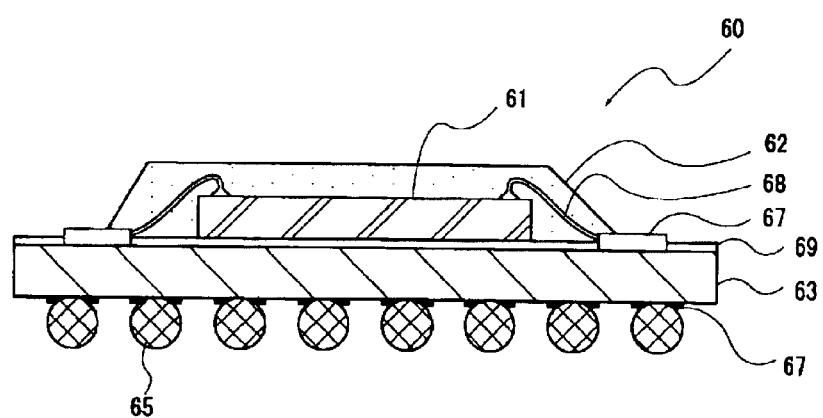
FIG. 10 is a sectional view for explaining the structure of a BGA (No. 1).

The BGA 60 shown in FIG. 10 is a semiconductor device with bumps including a bare chip 61, an interposer (substrate) 63 for mounting the bare chip 61 by wire bonding 68, and bumps (solder balls) 65 arranged in area array with a pitch of about 0.6 to 2.54 mm on the back of the interposer 63.

Figure 11:
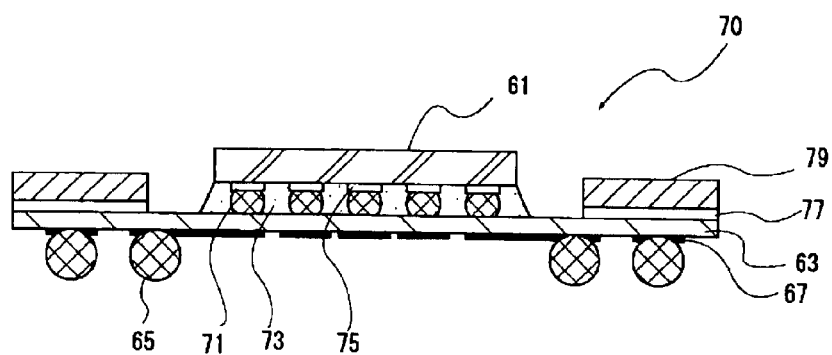
FIG. 11 is a sectional view for explaining the structure of another BGA (No. 2).

FIG. 11 shows the BGA 70 provided by a so-called flip chip method in which bumps 71 are formed on respective bonding pads 75 of the bare chip 61 in advance and are connected to inner leads (not shown) on the substrate 63 by heat reflow soldering or by ultrasonic vibration under compression.

Figure 12:
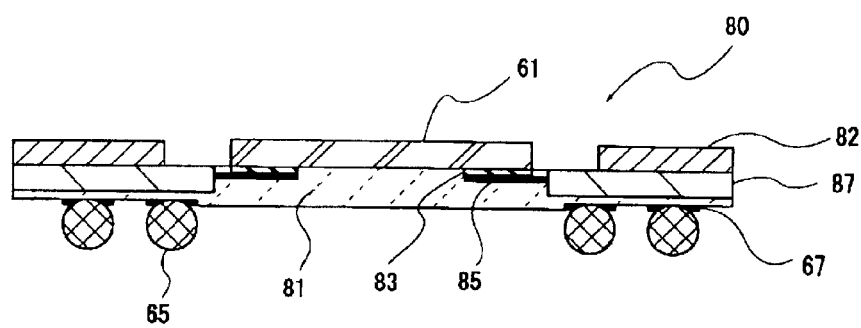
FIG. 12 is a sectional view for explaining the structure of yet another BGA (No. 3).

FIG. 12 shows the BGA 80 provided by a so-called tape automated bonding (TAB) method in which the bumps are formed on inner leads on the bare chip 61 or a tape, which are connected with each other by inner-lead bonding.

Figure 13:
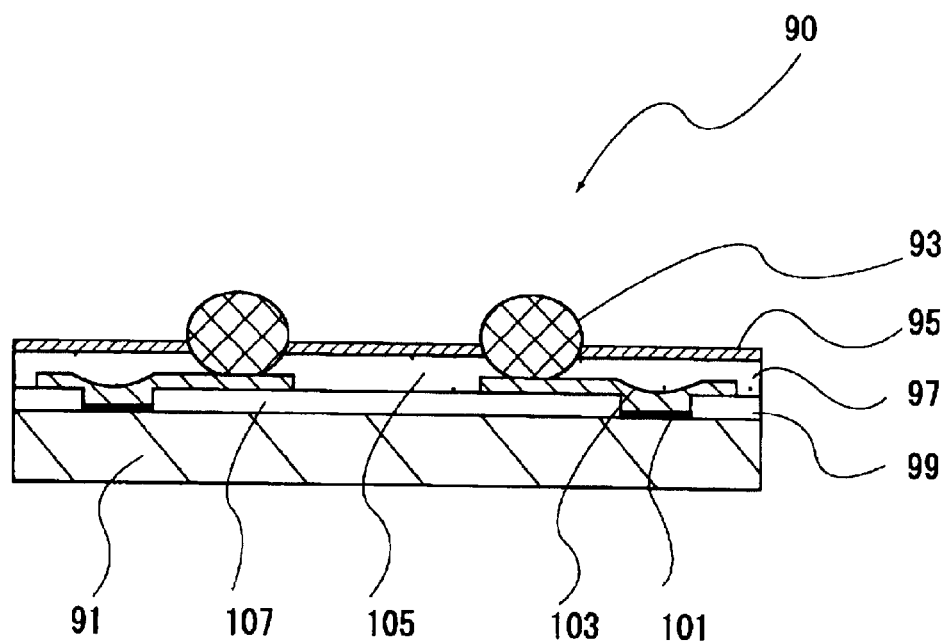
FIG. 13 is a sectional view for explaining the structure of a WCSP.

On the other hand, the WCSP in FIG. 13 is a CSP in which wires 103, electrical insulating films 97 and 107, and bumps (solder balls) 93 arranged in area array with a pitch of about 0.1 to 1.0 mm are formed in wafer stage without interposing an interposer. Particularly, this is a semiconductor device with bumps best suited to a thin, lightweight, and compact mounting structure.

(2) Bump

Figure 14A:
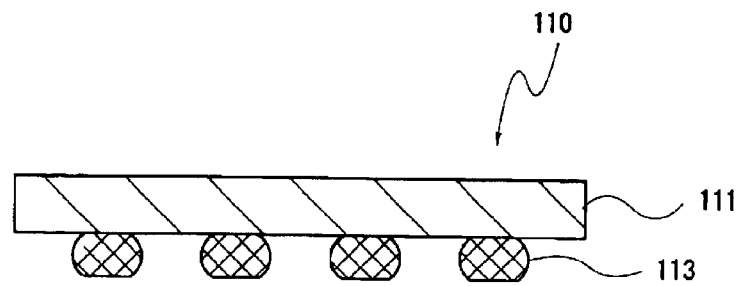
FIGS. 14(a) and 14(b) are diagrams for explaining an example of modifications of bumps in the semiconductor device with bumps.
Figure 14B:
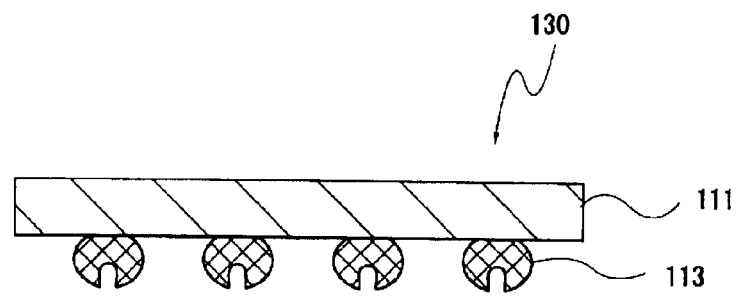

Although the shape of the bumps of the semiconductor device with bumps is not particularly limited, it is preferable that the ends of bumps 113 be flat as shown in FIG. 14(a).

This is because when the BGA is mounted by positioning on the pads of the substrate, the bumps of the BGA and the pads can be firmly fixed to each other while being moved evenly around the pads.

As to the shape of the bumps, as shown in FIG. 4(b), it is also preferable to provide a recess in the surface of each end of the bumps 113.

This is because the structure ensures that a solder material is present between the bumps of the semiconductor device and the pads via the recesses thereby to firmly fix them.

(3) Solder Material

The type of the solder material adhered to the bumps is not particularly limited and, for example, commonly used solder made of tin or lead and tin or flux materials such as rosin and pine rosin can be used. It is more preferable to use a combination of solder made of copper, tin, and silver without lead, and a flux material.

Second Embodiment

Figure 15:
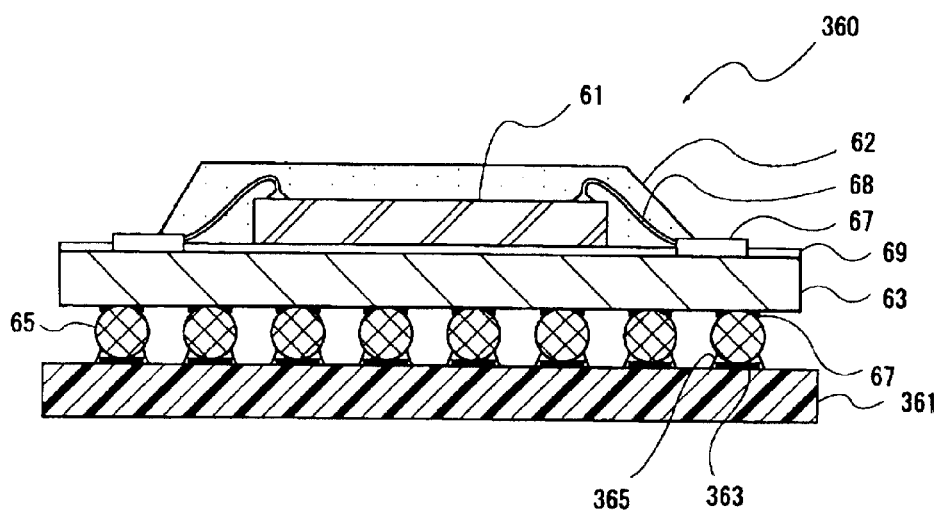
FIG. 15 is a diagram for explaining the mounting structure for a semiconductor device with bumps according to a second embodiment.

Referring to FIG. 15, a second embodiment is a mounting structure for a semiconductor device with bumps, characterized in that a semiconductor device with bumps is mounted to a circuit board via a solder material applied on pads, the circuit board including a region where the pitch in the longitudinal direction and the lateral direction of the pads are different from each other, in which the wires of the pads are preferentially drawn from a wider pitch side of the longitudinal direction or the lateral direction.

Points similar to those of the first embodiment will be omitted as appropriate and characteristic points of the second embodiment will be described hereinafter with particular emphasis thereon.

1. Structure (1) Basic Structure

A mounting structure 360 for the semiconductor device with bumps according to the second embodiment basically includes the semiconductor device (interposer) 63 with bumps, a circuit board 361, and a solder material 365, as shown in FIG. 15. Since the semiconductor device 63 with bumps, the circuit board 361, and the solder material 365 are the same as those of the first embodiment, a description thereof will be omitted here.

(2) Under Filling

Figure 16:
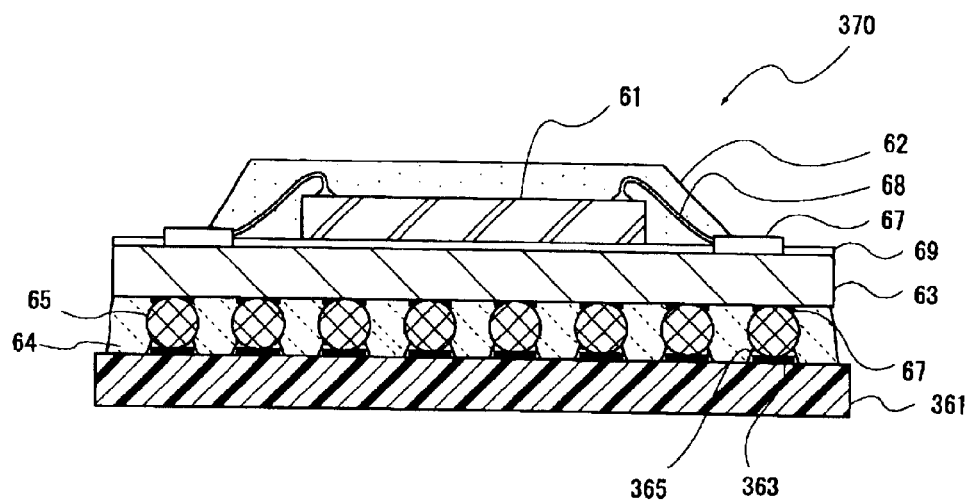
FIG. 16 is a diagram for explaining an under filling.

On the other hand, in the second embodiment, it is preferable that an under filling 64 with the following properties fills up between the semiconductor device with bumps (BGA) and the circuit board 361, as shown in FIG. 16.

1) Volume resistance within the range of $1 \times 10^6$ to $1 \times 10^{20}$ Ω cm;

2) Tensile strength within the range of 1 to 200 MPa; and

3) Elongation after fracture within the range of 10 to 500%.

Preferable types and properties of the under filling will be specifically described hereinafter.

1) Type

Preferable under fillings include a thermosetting resin and a photo-curing resin or any one of the curing resins.

This is because the use of such curing resins easily satisfies the basic properties as the under filling such as mechanical properties and moisture resistance.

Preferable thermosetting resins include, for example, an epoxy resin and a silicone resin. Preferable photo-curing resins include, for example, an epoxy resin, an acrylic resin, and a silicon resin.

In order to provide a light-blocking effect to the under filling, it is preferable to add a light-blocking material such as carbon particles, carbon fibers, and pigments, an ultraviolet absorbent or a fluorescent whitening agent into the curing resins.

This is because adding such compounds allows light from the exterior to be effectively absorbed and the wavelength of the light from the exterior to be converted to light with a wavelength that causes no photoelectric malfunction.

2) Volume Resistance

It is preferable to set the volume resistance of the under filling within the range of $1 \times 10^6$ to $1 \times 10^{20}$ Ω·cm.

This is because when the volume resistance of the under filling becomes less than $1 \times 10^6$ Ω·cm, the electrical insulation between the adjacent bumps may become insufficient and, on the other hand, when the volume resistance of the under filling exceeds $1 \times 10^{20}$ Ω·cm, the choice of available materials may be significantly limited.

Accordingly, it is more preferable to set the volume resistance of the under filling within the range of $1 \times 10^8$ to $1 \times 10^{18}$ Ω·cm and, it is further preferable to set it within the range of $1 \times 10^{10}$ to $1 \times 10^{16}$ Ω·cm.

3) Tensile Strength

It is preferable to set the tensile strength of the under filling within the range of 1 to 200 MPa.

This is because when the tensile strength of the under filling becomes less than 1 MPa, the mechanical strength may be decreased and the resistance stability and heat resistance of the mounting structure for semiconductor device with bumps may be decreased and, on the other hand, when the tensile strength of the under filling exceeds 200 MPa, the choice of available materials may be significantly limited or stress strain may occur excessively to reduce the resistance stability of the mounting structure for the semiconductor device with bumps.

Accordingly, it is more preferable to set the tensile strength of the under filling within the range of 5 to 100 MPa and further preferable to set it within the range of 10 to 50 MPa.

4) Elongation after Fracture

It is preferable to set the elongation after fracture of the under filling within the range of 10 to 500%.

This is because when the elongation after fracture of the under filling becomes less than 10%, the flexibility may be decreased and the resistance stability and heat resistance of the mounting structure for the semiconductor device with bumps may be decreased and, on the other hand, when the elongation after fracture of the under filling exceeds 500%, the choice of available materials may be significantly limited or the mechanical strength may be decreased.

Accordingly, it is more preferable to set the elongation after fracture of the under filling within the range of 30 to 300% and further preferable to set it within the range of 50 to 200%.

2. Mounting Method (1) First Mounting Method

Figure 17A:
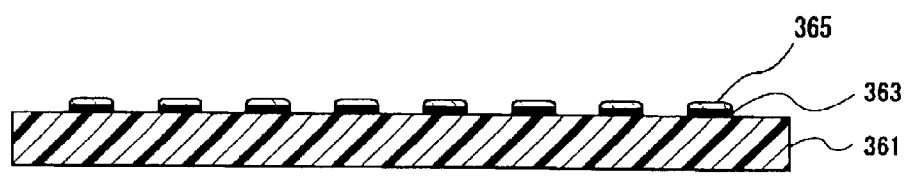
FIGS. 17(a) and 17(b) are process charts for explaining a method for mounting a semiconductor device with bumps onto a circuit board having a solder resist (No. 1).
Figure 17B:
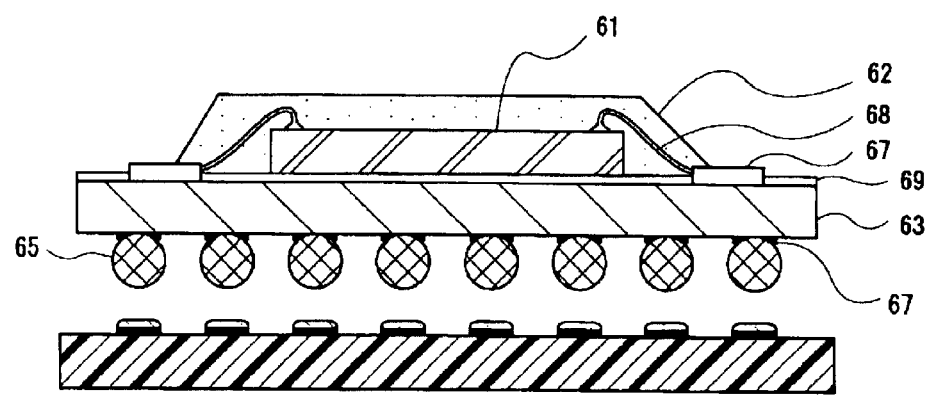

It is preferable to mount the semiconductor device 63 with bumps to the circuit board 361 in accordance with the following process steps (A) and (B), as shown in FIG. 17, as a first mounting method.

(A) Process steps for applying the solder material 365 on pads 363 on the circuit board 361.

(B) Process steps for mounting the semiconductor device 63 with bumps by reflowing on the pads 363 having the solder material 365 thereon.

Thus, the solder material can be applied with a conventional applicator such as a silk screen printer and also the semiconductor device with bumps can be mounted on the circuit board with a conventional reflow unit.

It is preferable to carry out the reflowing after the semiconductor device with bumps has been positioned to the pads on the substrate. In such a case, preferably, a positioning mark is provided in advance on the semiconductor device with bumps and the semiconductor device with bumps is positioned on the substrate using the positioning mark.

(2) Second Mounting Method

Figure 18A:
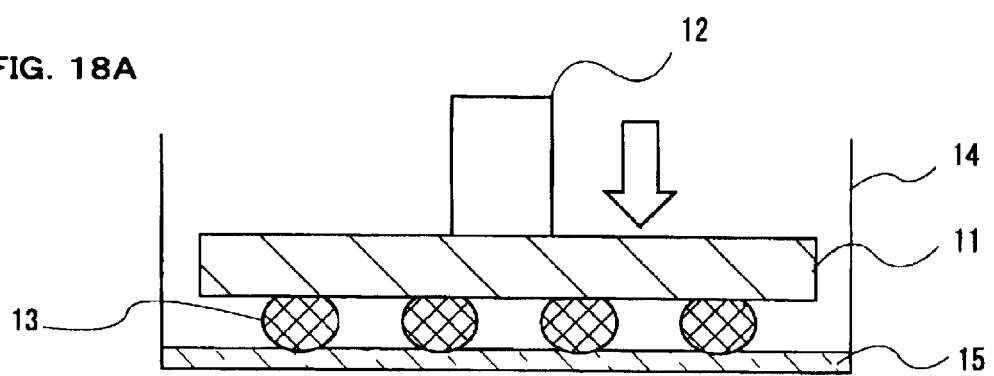
FIGS. 18(a) and 18(b) are process charts for explaining another method for mounting a semiconductor device with bumps onto a circuit board having a solder resist (No. 2).
Figure 18B:
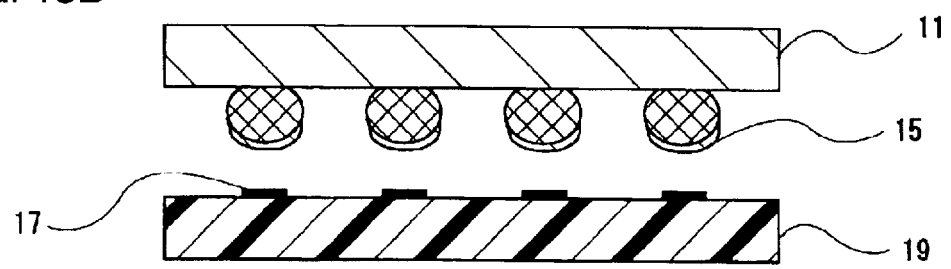

It is preferable to mount a semiconductor device 11 with bumps to a circuit board 19 having pads 17 in accordance with the following process steps (A') and (B), as shown in FIG. 18, as a second mounting method.

(A') Process steps for applying a solder material 15 on bumps 13 of the semiconductor device 11 with bumps.

(B) Process steps for mounting the semiconductor device 11 with bumps having the solder material 15 thereon on the pads 17 by reflowing.

Thus, the process of positioning when applying the solder material on the pads can be omitted and a semiconductor device with fine bumps can be mounted also on a relatively easily deformable substrate such as an FPC by reflowing. In other words, a method for mounting a semiconductor device with bumps can be provided by which a semiconductor device with bumps, particularly, a semiconductor device with fine bumps such as a BGA and a CSP can be mounted quickly and at low cost by reflowing also on a substrate, particularly, on an FPC, and which causes less mounting errors.

(3) Third Mounting Method

It is preferable to mount the semiconductor device 11 with bumps to the circuit board 19 in accordance with the following process steps (A"), (A'''), and (B'), as shown in FIG. 19, as a third mounting method.

(A") Process steps for applying a part 21 of a solder material on the pads 17 of the circuit board 19.

(A''') Process steps for applying another part 15 of the solder material on the bumps 13 of the semiconductor device 11 with bumps.

(B') Process steps for mounting the semiconductor device 11 with bumps having the part of the solder material 15 thereon on the pads 17 having the part of the solder material 21 thereon by reflowing.

Thus, a method for mounting a semiconductor device with bumps can be provided by which a semiconductor device with fine bumps can be mounted accurately and firmly by reflowing also on a substrate, particularly, on an FPC.

(4) Conditions for Reflowing

Although the conditions for reflowing are not particularly limited in carrying out the first to third embodiments, it is preferable to perform the heating under the conditions of a peak temperature of 200 to 300° C. for five seconds to ten minutes with infrared rays or heating inert gas.

It is also preferable to perform the reflowing in an inactive condition so as not to oxidize the solder material during reflowing.

(5) Simultaneous Mounting with Other Elements

Figure 20:
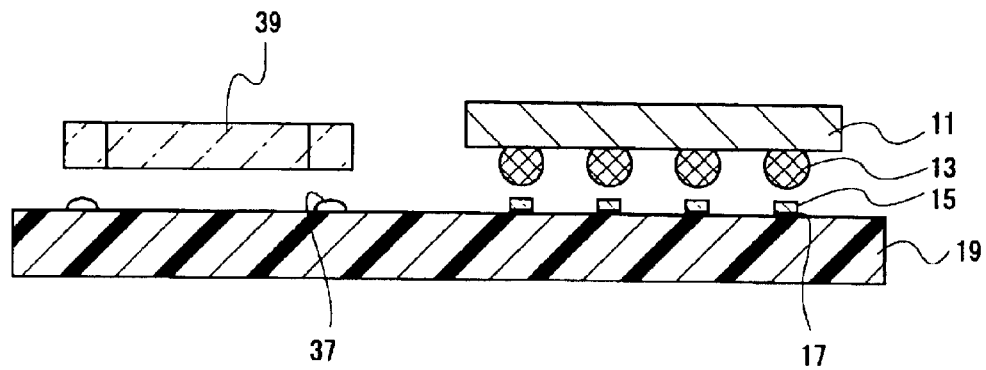
FIG. 20 is a diagram for explaining a method for simultaneously mounting a semiconductor device with bumps onto a circuit board together with another electric element.

As shown in FIG. 20, it is preferable to mount the semiconductor device 11 with bumps to the circuit board 19 simultaneously with other electric elements 39 including a capacitor in carrying out the first to third mounting methods.

This is because mounting the semiconductor device with bumps simultaneously with the other electric elements including a capacitor reduces mounting processes using the ACF or the like other than by the reflowing. Thus, the entire process of mounting the semiconductor device with bumps can be simplified and sped up.

Although the elements other than the semiconductor device with bumps, such as a capacitor and a resistive element, are generally mounted by reflowing, the semiconductor device with bumps is mounted with the ACF or the like, thus having the problem that they must be mounted by a different mounting method.

Third Embodiment

A third embodiment is an electro-optic device characterized by including a semiconductor device with bumps mounted on a circuit board having a region where the pitch in the longitudinal direction and the lateral direction of the pads are different from each other as a driving element or a power-supply element, in which the wires of the pads are preferentially drawn from a wider pitch side of the longitudinal direction or the lateral direction.

Figure 21:
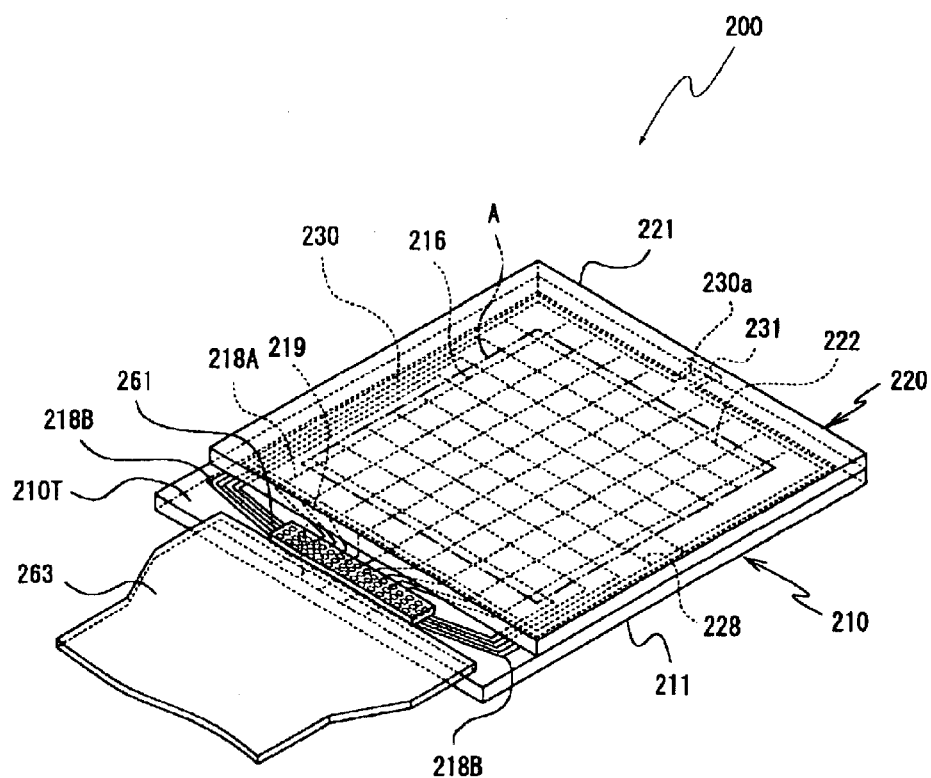
FIG. 21 is a schematic perspective view showing the appearance of a liquid crystal panel according to a third embodiment of the present invention.

A liquid crystal panel that forms an electro-optic device shown in FIG. 21 will be described as an example.

Figure 22:
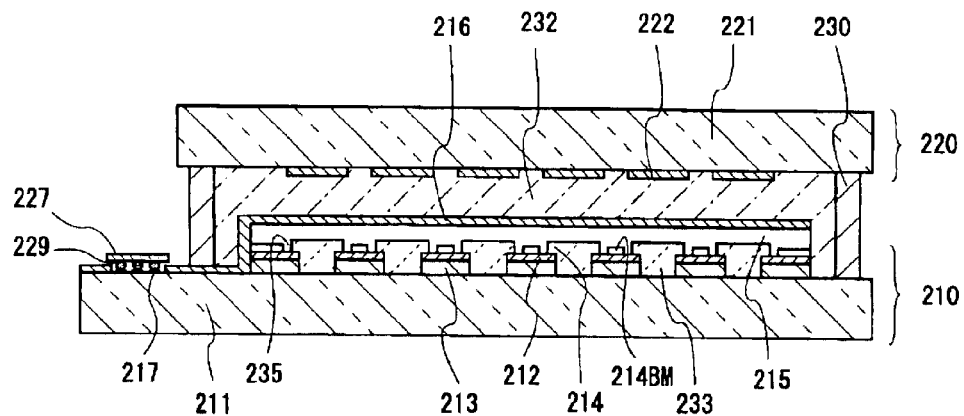
FIG. 22 is a schematic perspective view showing the panel structure of the third embodiment.

Referring to FIG. 22, the schematic structure of a liquid crystal panel 200 in FIG. 21 will first be described. FIG. 22 schematically shows the state of the liquid crystal panel 200 of FIG. 21 before a semiconductor IC and a flexible wiring board are mounted thereon. In the drawing, the dimensions are adjusted for convenience in the drawing and select components are omitted as appropriate.

The liquid crystal panel 200 includes a color filter substrate 210 having a transparent electrode 216 on the multilayer of a reflecting layer 212, a plurality of color layers 214, and a surface protective layer 215 on the first substrate 211 and a counter substrate 220 opposed thereto, which are bonded together with a sealing material 230 and has a liquid crystal material 232 therein. The transparent electrode 216 connects to a wire 218A as described above and the wire 218A passes between the sealing material 230 and the first substrate 211 and is drawn onto the surface of a substrate extending section 210T. The substrate extending section 210T also has an input terminal section 219 thereon.

The substrate extending section 210T is characterized by including a region where the pitch in the longitudinal direction and the lateral direction of the plurality of pads are different from each other as a driving element or a power-supply element, in which the wires of the pads are preferentially drawn from a wider pitch side of the longitudinal direction or the lateral direction of the pads.

Accordingly, a solder material can be accurately applied to the pads on the substrate extending section 210T with a wide margin, thus providing the substrate extending section 210T having less displacement of a semiconductor device due to the difference in the position of application even when a semiconductor device with fine bumps such as a BGA is mounted.

This ensures stability in liquid-crystal driving by the semiconductor device with bumps and provides the liquid crystal device with high durability.

Fourth Embodiment

An embodiment of the electro-optic device according to the invention used as a display of an electronic device will be specifically described.

(1) Outline of Electronic Device

Figure 23:
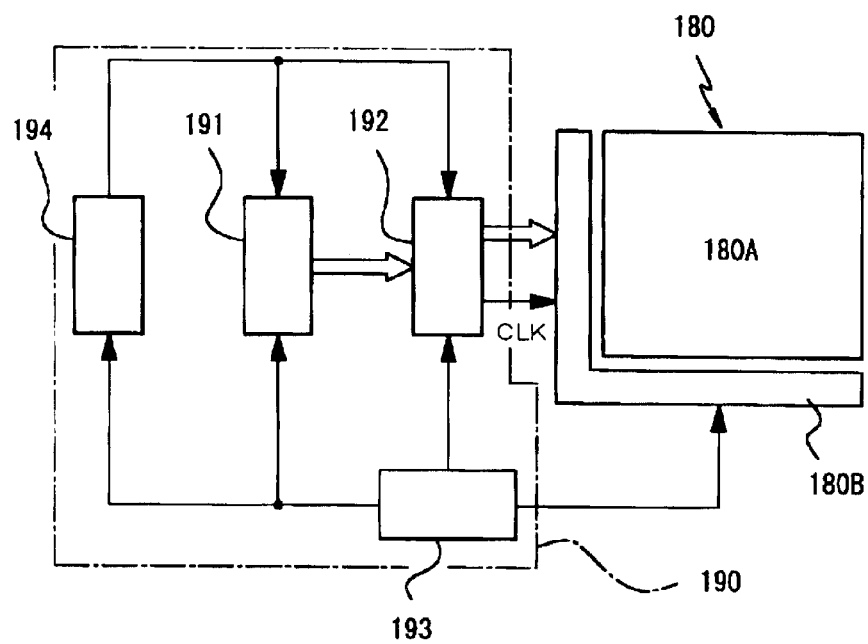
FIG. 23 is a schematic block diagram of an electronic device according to an embodiment of the invention.
Figure 24:
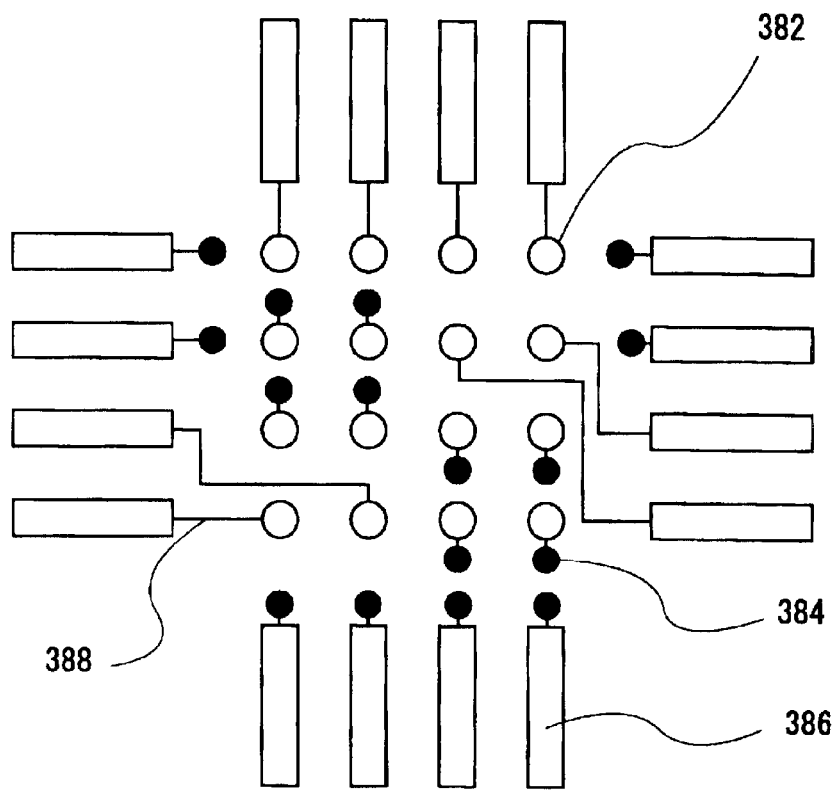
FIG. 24 is a diagram for explaining a conventional circuit board.
Figure 25:
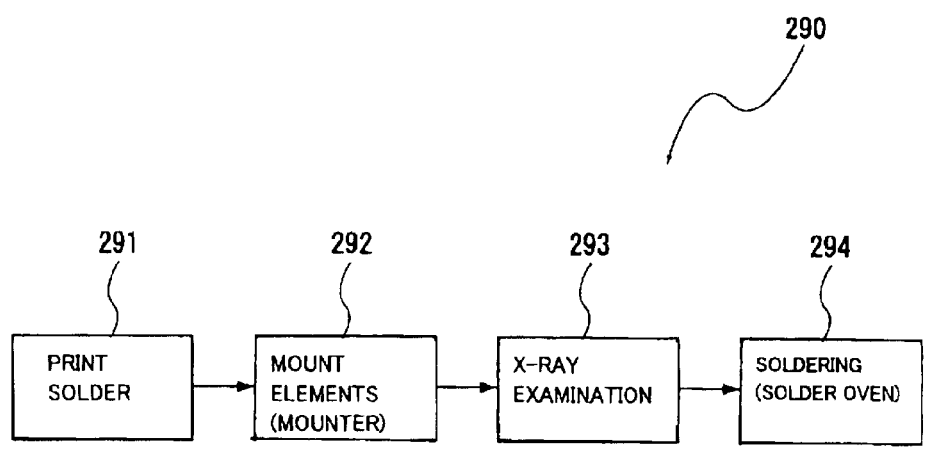
FIG. 25 is a flowchart for explaining a conventional method for mounting a BGA.
Figure 26A:
FIG. 26 is a diagram for explaining a method for mounting a semiconductor device with bumps using an anisotropic conductive film (ACF).
Figure 26B:
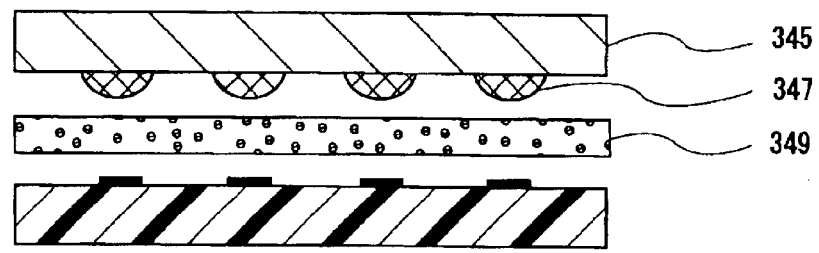
Figure 26C:
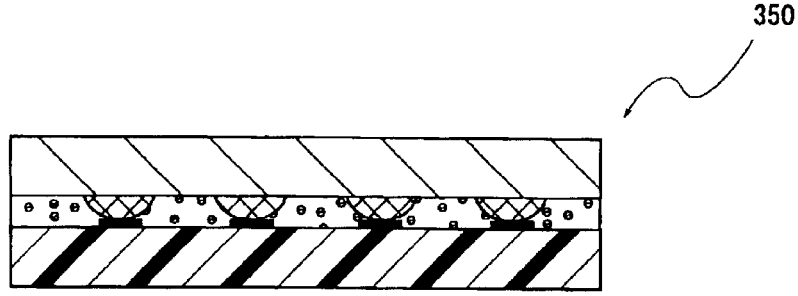

FIG. 23 is a schematic block diagram showing the entire construction of an electronic device according to an embodiment of the invention. The electronic device includes a liquid crystal panel 180 and a control means 190 for controlling it. FIG. 23 illustrates the liquid crystal panel 180 divided conceptually into a panel structure 180A and a driving circuit 180B formed of a semiconductor IC.

The control means 190 preferably includes a display-information output source 191, a display-information processing circuit 192, a power-supply circuit 193, and a timing generator 194.

Preferably, the display-information output source 191 includes a memory having a read only memory (ROM), a random access memory (RAM) and so on, a storage unit having a magnetic storage disk, an optical storage disk and so on, and a tuning circuit for synchronously outputting a digital image signal and is constructed to supply display information in the form of an image signal in a predetermined format or the like to the display-information processing circuit 192 on the basis of various clock signals generated by the timing generator 194.

Preferably, the display-information processing circuit 192 includes various known circuits such as a serial-parallel converter, an amplifying/inverting circuit, a rotation circuit, a gamma collection circuit, and a clamp circuit and carries out the processing of the inputted display information and supplies its image information to the driving circuit 180B together with a clock signal CLK. The driving circuit 180B preferably includes a scanning-line driving circuit, a data-line driving circuit, and a check circuit. The power-supply circuit 193 has the function of supplying a predetermined voltage to each of the above-described components.

(2) Specific Examples

Electronic devices capable of incorporating the liquid crystal device serving as the electro-optic device according to the invention include an organic electroluminescence device, an inorganic electroluminescence device, a plasma display device, a field emission display (FED) device, a light-emitting diode (LED) display device, an electro-phoretic display device, a low-profile cathode-ray tube, a liquid-crystal shutter, a digital micromirror device (DMD) including a liquid-crystal TV, a view-finder/direct-monitor video-tape recorder, a car navigation system, a pager, an electronic notebook, an electronic calculator, a word processor, a work station, a TV phone, a point-of-sale (POS) terminal, and an electronic device with a touch panel, in addition to a personal computer and a cellular phone among others.

It is to be understood that the electro-optic device and the electronic device according to the invention are not limited to the above-described examples and various modifications may be made without departing from the spirit and scope of the invention. For example, although the liquid crystal panel in the above-described embodiments has a simple matrix structure, the invention can also be applied to an active-matrix electro-optic device that uses an active element such as a thin-film transistor (TFT) or a thin-film diode (TFD).

Effect of the Invention

As described above, the present invention provides a circuit board having a region where the pitch in the longitudinal direction and the lateral direction of the plurality of pads are different and in which wires are preferentially drawn from a wider pitch side of the longitudinal direction or the lateral direction of the pads, thus allowing a solder material to be accurately applied to the pads on the circuit board with a wide margin, thus causing less displacement in a mounting position even when a semiconductor device with fine bumps such as a BGA is mounted.

The present invention provides a mounting structure for a semiconductor device with bumps having a region where the pitch in the longitudinal direction and the lateral direction of the pads are different and in which wires are preferentially drawn from a wider pitch side of the longitudinal direction or the lateral direction of the pads, thus causing less displacement in a mounting position even when a semiconductor device with fine bumps such as a BGA is mounted.

The present invention provides an electro-optic device and an electronic device including the same which use a circuit board having a region where the pitch in the longitudinal direction and the lateral direction of the pads are different and in which wires are preferentially drawn from a wider pitch side of the longitudinal direction or the lateral direction of the pads, thus causing less poor soldering and having high production efficiency.

The entire disclosure of Japanese Patent Application No. 2002-298981 filed Oct. 11, 2002 is incorporated by reference.

What is claimed is:

1. A circuit board comprising:

a plurality of pads for mounting a semiconductor device with bumps; and a plurality of wires drawn from the respective pads;

wherein the circuit board has a region where pitch in a longitudinal direction and a lateral direction of the plurality of pads are different from each other and the plurality of wires are drawn from a wider pitch side of the longitudinal direction and the lateral direction of the pads.

2. The circuit board according to claim 1, wherein a ratio P1/P2 is set within a range of 1.01 to 3 where P1 is a wider pitch of the pads and P2 is a narrower pitch.

3. The circuit board according to claim 1, wherein a wider pitch of the pads is set within a range of 0.4 to 2.0 mm and a narrower pitch is set to a value smaller than that of the wider pitch.

4. The circuit board according to claim 1, wherein an aspect ratio of the pad is determined in proportion to the pitch of the longitudinal direction of the pads and the pitch of the lateral direction of the pads.

5. The circuit board according to claim 1, wherein the region where the pitch in the longitudinal direction and the lateral direction of the pads are different from each other comprises a center of a surface of the semiconductor device.

6. The circuit board according to claim 1, wherein the region where the pitch in the longitudinal direction and the lateral direction of the pads are different from each other comprises a periphery of a surface of the semiconductor device.

7. The circuit board according to claim 1, wherein the region where the pitch in the longitudinal direction and the lateral direction of the pads are different from each other comprises a block structure, and the wires of the pads are drawn through spaces between the blocks.

8. The circuit board according to claim 1, wherein the semiconductor device comprises a ball grid array.

9. A mounting structure comprising:

a semiconductor device with bumps mounted to a circuit board through a solder material applied on pads;

the circuit board having a region where pitch in a longitudinal direction and a lateral direction of the pads are different from each other;

wherein the plurality of wires are drawn from a wider pitch side of the longitudinal direction or the lateral direction of the pads.

10. The mounting structure for a semiconductor device with bumps according to claim 9, wherein part of the solder material is adhered to the pads of the semiconductor device with bumps.

11. The mounting structure for a semiconductor device with bumps according to claim 9, wherein an under filling having the following properties fills an area between the semiconductor device with bumps and the circuit board:

1) Volume resistance within the range of $1 \times 10^6$ to $1 \times 10^{20}$ $\Omega \cdot cm$;

2) Tensile strength within the range of 1 to 200 MPa; and

3) Elongation within the range of 10 to 500%.

12. An electro-optic device comprising:

a semiconductor device mounted on a circuit board having a region where pitch in a longitudinal direction and a lateral direction of the pads are different from each other as one of a driving element and a power-supply element;

wherein wires are drawn from a wider pitch side of the longitudinal direction or the lateral direction of the pads.

13. An electronic device comprising the electro-optic device according to claim 12 and control means for controlling the electro-optic device.

* * * * *